(12) United States Patent
Song

(10) Patent No.: US 8,183,763 B2
(45) Date of Patent: May 22, 2012

(54) ORGANIC LIGHT EMITTING DISPLAY AND METHOD OF FABRICATING THE SAME

(75) Inventor: Myung-Won Song, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 89 days.

(21) Appl. No.: 12/401,465

(22) Filed: Mar. 10, 2009

(65) Prior Publication Data

US 2010/0231124 A1    Sep. 16, 2010

Related U.S. Application Data

(60) Provisional application No. 61/079,023, filed on Jul. 8, 2008.

(51) Int. Cl.
*H01L 51/00* (2006.01)
(52) U.S. Cl. .................. 313/504; 313/506; 257/40
(58) Field of Classification Search .............. 313/504, 313/506; 257/40, 98–100
See application file for complete search history.

(56) References Cited

U.S. PATENT DOCUMENTS

| | | |
|---|---|---|
| 6,977,464 B2 | 12/2005 | Yoshikawa |
| 7,056,180 B2 | 6/2006 | Morii |
| 7,682,851 B2 * | 3/2010 | Lee et al. .................. 438/26 |
| 2004/0262613 A1 | 12/2004 | Maekawa et al. |
| 2005/0285987 A1 | 12/2005 | Azumada et al. |
| 2007/0194699 A1 | 8/2007 | Lee et al. |
| 2009/0215350 A1* | 8/2009 | Takei et al. .................. 445/23 |

FOREIGN PATENT DOCUMENTS

| | | |
|---|---|---|
| EP | 1 505 666 A2 | 2/2005 |
| JP | 2007-108469 | 4/2007 |
| JP | 2007108469 | * 4/2007 |
| KR | 10-0793859 | 1/2008 |
| WO | WO 2007/148540 A1 | 12/2007 |

OTHER PUBLICATIONS

European Search Report dated Oct. 15, 2009, for corresponding European application 09164876.6, noting listed references in this IDS.

KIPO Office action dated Sep. 30, 2010, for priority Korean Patent application 10-2009-0022655, noting Japanese reference 2007-108469, previously filed in an IDS dated Jan. 6, 2010.

* cited by examiner

*Primary Examiner* — Karabi Guharay
(74) *Attorney, Agent, or Firm* — Christie, Parker & Hale, LLP

(57) ABSTRACT

An organic light emitting display and a method of fabricating the same, in which the resistance of a cathode electrode is reduced by applying a conductive ink material on the cathode electrode. A pixel defining layer is formed on a substrate, with a recess or depression in a non-light emitting region of the pixel defining layer. An electrode on the substrate includes a portion within the recess of the pixel defining layer. The conductive ink is in the portion of the electrode in the recess.

16 Claims, 5 Drawing Sheets

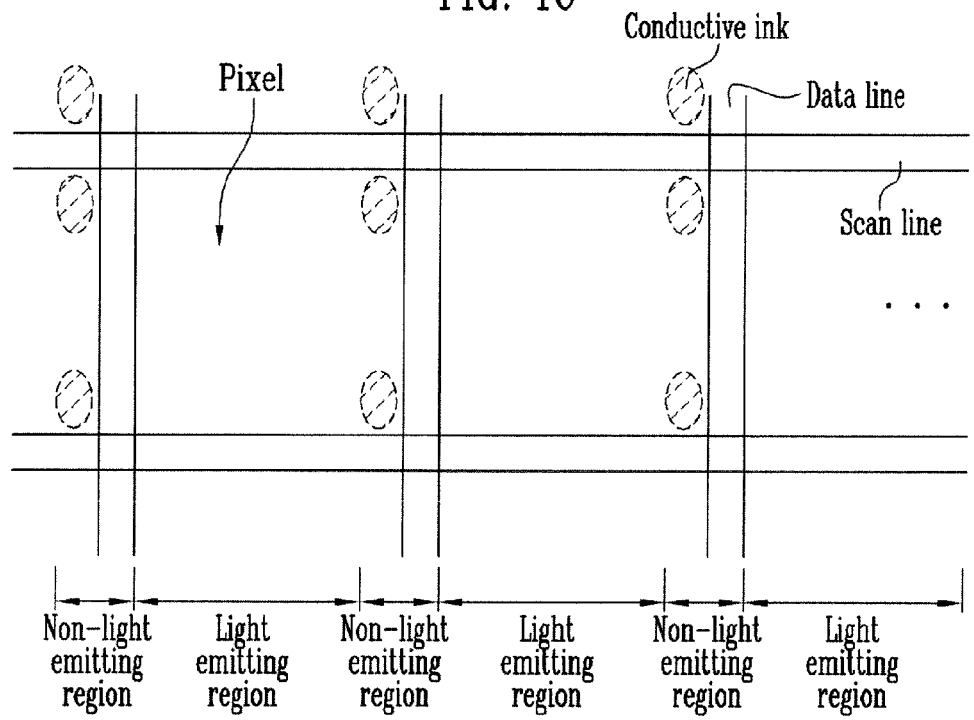
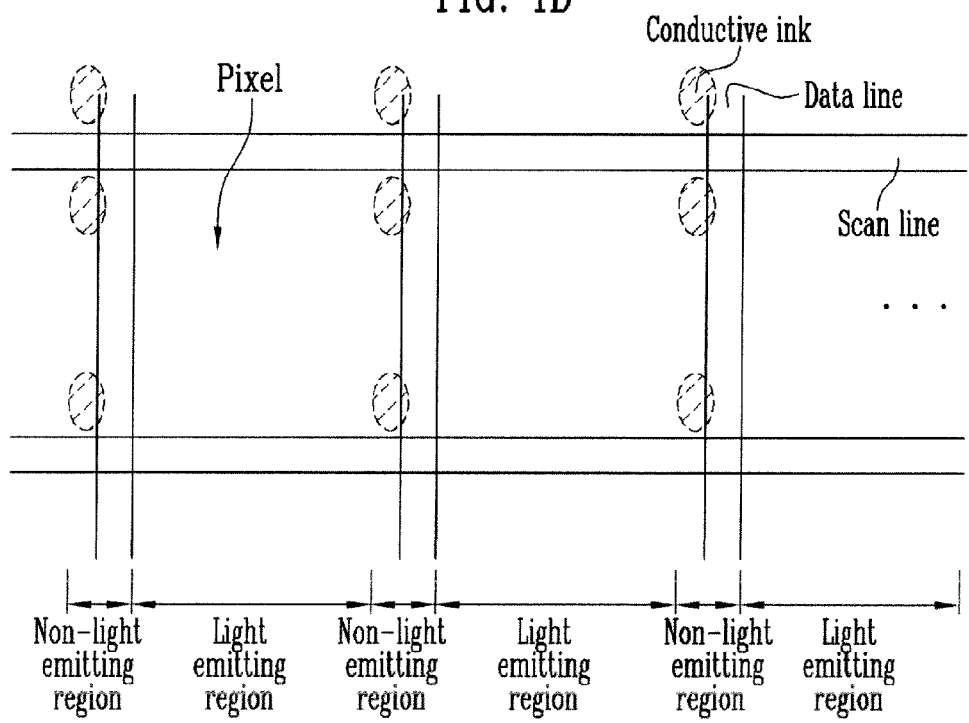

ORGANIC LIGHT EMITTING DISPLAY AND METHOD OF FABRICATING THE SAME

CROSS-REFERENCE TO RELATED APPLICATIONS

This application claims priority to and the benefit of U.S. Provisional Patent Application No. 61/079,023, filed on Jul. 8, 2008, the entire content of which is incorporated herein by reference.

BACKGROUND

1. Field of the Invention

The present invention relates to an organic light emitting display, and a method of fabricating the same.

2. Discussion of Related Art

Generally, electroluminescence displays, which are self-luminous displays, electrically excite fluorescent materials to emit light. These electroluminescence displays have generated significant interest as next-generation displays due to advantages such as low voltage operation, a very slim form factor, a wide viewing angle, a high speed response, etc., which are advantages that generally cannot be achieved in liquid crystal displays.

Electroluminescence displays include inorganic light emitting displays and organic light emitting displays, depending on whether the material that makes up the light emitting layer is an inorganic material or an organic material.

Organic light emitting displays have an organic layer in a pattern (e.g., a predetermined pattern) formed on a glass substrate or other transparent insulating substrate. An anode electrode layer and a cathode electrode layer are formed on an upper part and a lower part of the organic layer, respectively. The organic layer includes organic compounds that form a light emitting layer.

In the organic light emitting display configured as described above, a positive voltage and a negative voltage are applied to an anode electrode and a cathode electrode, respectively, such that holes move from the anode electrode with the positive voltage to the light emitting layer via a hole transportation layer, and electrons move from the cathode electrode with the negative voltage to the light emitting layer via an electron transportation layer. Accordingly, the electrons and the holes are recombined in the light emitting layer to generate excitons, and the excitons change from an excited state to a ground state, so that fluorescent molecules of the light emitting layer emit light to form an image.

FIG. 1 is a circuit diagram showing a conventional pixel of an organic light emitting display. Referring to FIG. 1, the pixel 4 of the organic light emitting display includes a pixel circuit 2 coupled to an organic light emitting diode OLED, a data line Dm, and a scan line Sn to control light emission of the organic light emitting diode OLED.

An anode electrode of the organic light emitting diode OLED is coupled to the pixel circuit 2 and a cathode electrode of the organic light emitting diode OLED is coupled to a second power supply ELVSS. The organic light emitting diode OLED emits light corresponding to a current supplied from the pixel circuit 2.

The pixel circuit 2 controls the amount of current supplied to the organic light emitting diode OLED in accordance with to a data signal supplied to the data line Dm when a scan signal is supplied to the scan line Sn.

To this end, the pixel circuit 2 includes a second transistor M2 coupled between a first power supply ELVDD and the organic light emitting diode OLED; a first transistor M1 coupled between the second transistor M2 and the data line Dm, and coupled to the scan line Sn to receive the scan signal; and a storage capacitor Cst coupled between a first electrode and a gate electrode of the second transistor M2.

A gate electrode of the first transistor M1 is coupled to the scan line Sn and a first electrode of the first transistor M1 is coupled to the data line Dm. A second electrode of the first transistor M1 is coupled to one terminal of the storage capacitor Cst.

Herein, the first electrode is one of a source electrode and a drain electrode, and the second electrode is the other one of the source electrode and the drain electrode. For example, if the first electrode is the source electrode, the second electrode is the drain electrode. The first transistor M1 coupled to the scan line Sn and the data line Dm is turned on when the scan signal is supplied from the scan line Sn to supply the data signal supplied from the data line Dm to the storage capacitor Cst. At this time, the storage capacitor Cst charges a voltage corresponding to the data signal.

The gate electrode of the second transistor M2 is coupled to one terminal of the storage capacitor Cst and the first electrode of the second transistor M2 is coupled to the other terminal of the storage capacitor Cst and the first power supply ELVDD. The second electrode of the second transistor M2 is coupled to the anode electrode of the organic light emitting diode OLED.

The second transistor M2 controls the amount of current flowing from the first power supply ELVDD to the second power supply ELVSS via the organic light emitting diode OLED, where the amount of current corresponds to a voltage value stored in the storage capacitor Cst. According to this configuration, the organic light emitting diode OLED generates light corresponding to the amount of current supplied from the second transistor M2.

The organic light emitting display may be a top emission type, a bottom emission type, or both, according to a light emitting direction. Recently, as flat displays have become bigger in size, the adoption of the top emission type has been preferred.

In top emission type organic light emitting displays, the lower part of the organic layer is coupled to the anode electrode and the upper part of the organic layer transmitting light is coupled to the cathode electrode.

In some organic light emitting displays, the cathode electrode includes a transflective layer (i.e., a layer that both transmits and reflects light), and in the case of the top emission type, a cathode electrode having a low work function and a transflective characteristic is frequently utilized.

Accordingly, the cathode electrode may be very thin to implement the transflective characteristic. In this case, the cathode electrode has a high resistance.

In particular, in the case where the organic light emitting display is driven with current, a voltage drop (i.e., an IR drop) occurs by resistance of a line and/or an electrode. Here, in the case of the top emission type organic light emitting display, the voltage drop is caused by the high resistance of the thin, transflective cathode electrode, making it difficult to properly implement the display.

In other words, a cathode electrode having a high resistance can result in a serious luminance non-uniformity in the inside of the panel and, particularly in large-area organic light emitting displays, a voltage drop (IR drop) occurs between the center portion and the outer portion of the panel, restricting current injection for high luminance emission in a high definition display.

SUMMARY OF THE INVENTION

An organic light emitting display and a method of fabricating the same, in which the resistance of a cathode electrode is reduced by applying a conductive ink material on the cathode electrode, is provided in embodiments according to the present invention.

An organic light emitting display according to an exemplary embodiment of the present invention includes a pixel defining layer on a substrate, with a recess in a non-light emitting region of the pixel defining layer. An electrode on the substrate includes a portion within the recess of the pixel defining layer. A conductive ink is in the portion of the electrode in the recess. The non-light emitting region may be between a thin film transistor region of a pixel and a data line region. Further, to provide for a deeper recess, and thus an increased amount of conductive ink, the recess may extend into a planarization layer under the pixel defining layer. The electrode may be a transflective cathode electrode. Further, the conductive ink may include a high-conductivity material.

Another exemplary embodiment of the present invention is a method of fabricating an organic light emitting display. According to this embodiment, a pixel defining layer is formed on a substrate. A recess is formed in a non-light emitting region of the pixel defining layer. An electrode is formed on the pixel defining layer, the electrode having a portion in the recess. A conductive ink is placed on the portion of the electrode in the recess. The non-light emitting region may be between a thin film transistor region of a pixel and a data line region. Forming the recess may include extending the recess into a planarization layer under the pixel defining layer. The electrode may be a transflective cathode electrode. The conductive ink may be placed in the recess by using an inkjet printing method, and may include a solvent with a boiling point less than 100° C. The solvent may be one or more of alcohol, ether, benzene, ethyl acetate, and chloroform.

In another embodiment, a display device includes a plurality of light emitting regions and a plurality of non-light emitting regions. Each non-light emitting region is between adjacent ones of the light emitting regions. A cathode electrode is on the light emitting regions and the non-light emitting regions, the cathode electrode having a recess at at least one of the non-light emitting regions. A conductive ink is in the recess. A pixel defining layer may be under the cathode electrode, the pixel defining layer defining the plurality of pixels having the plurality of light emitting regions, and having a first depression corresponding to the recess, such that a portion of the cathode electrode is on an inner wall of the first depression. A planarization layer may further be under the pixel defining layer, the planarization layer having a second depression corresponding to the recess, such that another portion of the cathode electrode is on an inner wall of the second depression.

BRIEF DESCRIPTION OF THE DRAWINGS

The accompanying drawings, together with the specification, illustrate exemplary embodiments of the present invention, and, together with the description, serve to explain the principles of the present invention.

FIGS. 4A to 4D are plan views of an organic light emitting display according to exemplary embodiments of the present invention.

DETAILED DESCRIPTION

Figure 1:
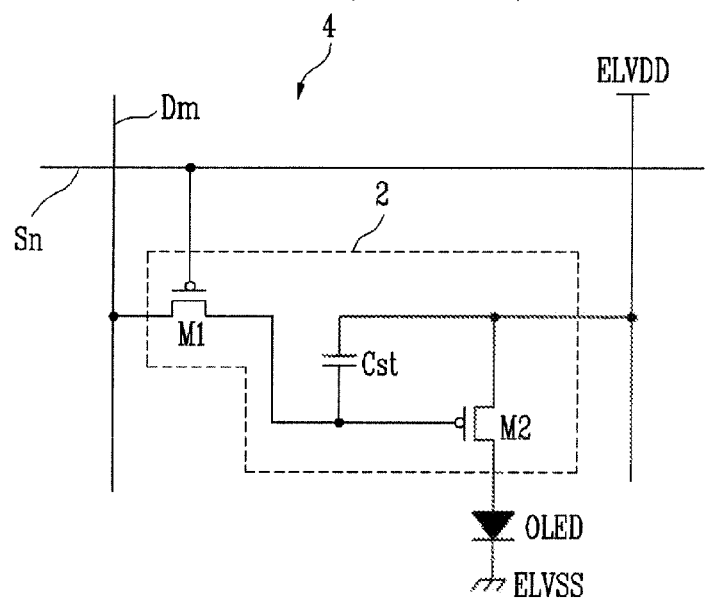
FIG. 1 is a circuit diagram illustrating a pixel in a conventional organic light emitting display.

In the following detailed description, only certain exemplary embodiments of the present invention are shown and described, simply by way of illustration. Here, when a first element is described as being coupled to a second element, the first element may be directly coupled to the second element, or may be indirectly coupled to the second element via a third element. Further, some of the elements that are not essential to obtain a complete understanding of the invention have been omitted for clarity. Like reference numerals refer to like elements throughout.

Hereinafter, exemplary embodiments of the present invention will be described in more detail with reference to the accompanying drawings.

Figure 2A:
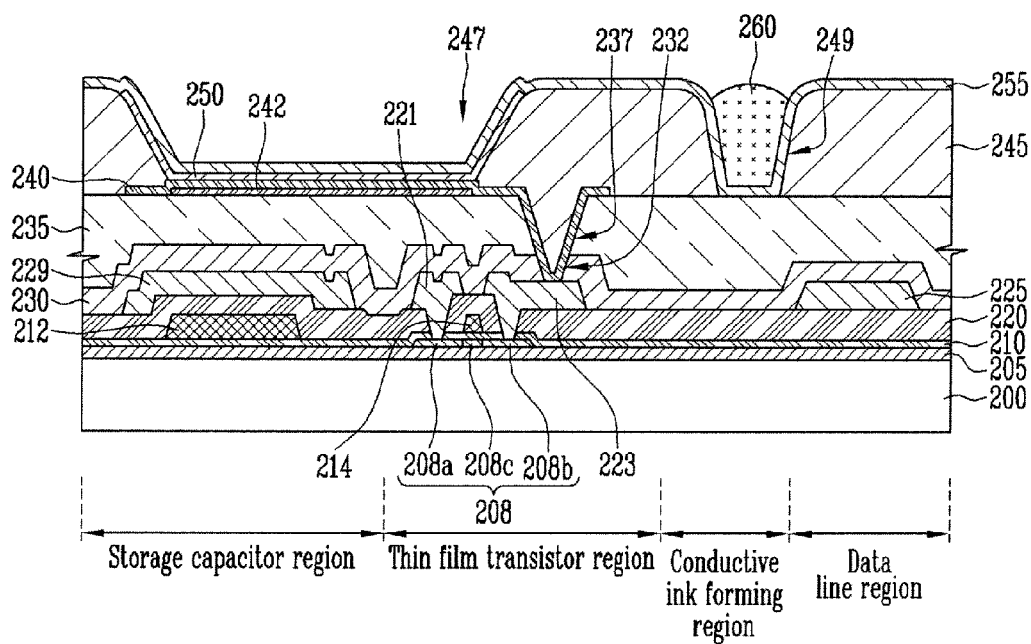
FIGS. 2A and 2B are cross-sectional views of an organic light emitting display according to exemplary embodiments of the present invention.
Figure 2B:
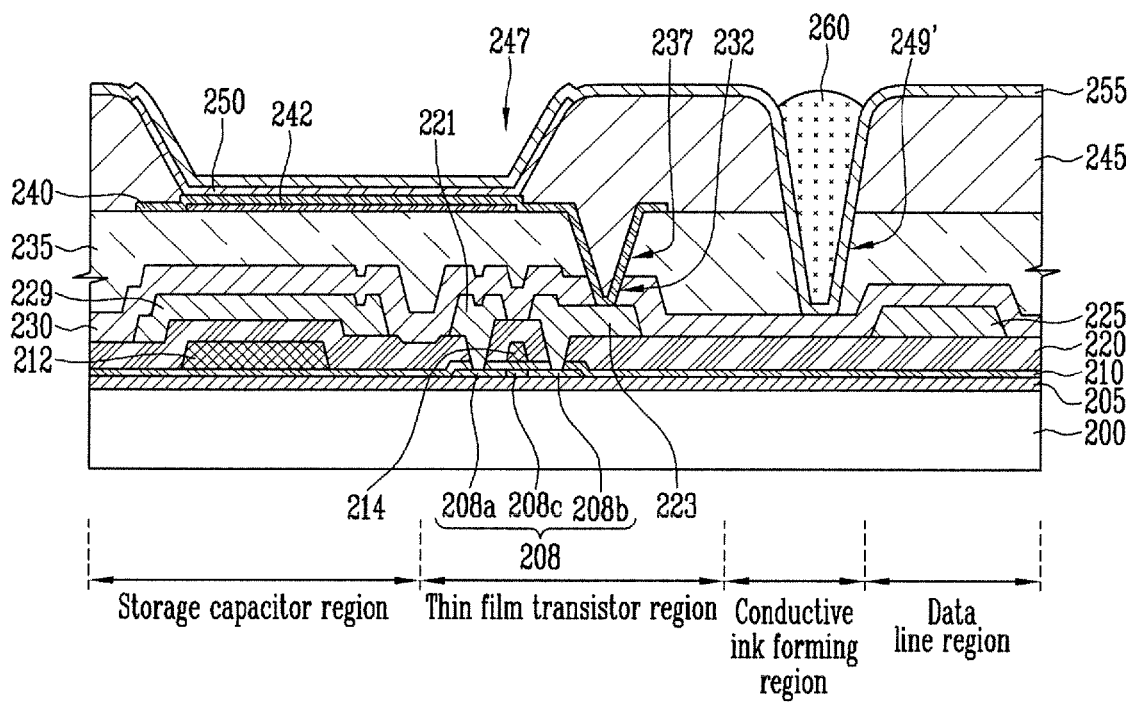

FIGS. 2A and 2B are cross-sectional views of an organic light emitting display according to exemplary embodiments of the present invention.

FIG. 2A illustrates a pixel region including a storage capacitor region and a thin film transistor region, a conductive ink forming region, and a data line region in an organic light emitting display according to an exemplary embodiment of the present invention.

In order to reduce the resistance of a thin, transflective cathode electrode 255, which has high resistance, a conductive ink forming region is provided between the thin film transistor region and the data line region. The conductive ink forming region is implemented in a concave shape so that a conductive ink 260 with a low resistance is placed on the cathode electrode 255 in the conductive ink forming region by an inkjet printing method.

In other words, the conductive ink forming region, which is a non-light emitting region, has a concave shape, formed by an etching of a pixel defining layer (PDL) 245 and/or a planarization layer 235 below the cathode electrode 255 (referring to FIG. 2B).

Thus, if a portion of the cathode electrode 255 is formed in the concave shaped portion (e.g., the depression or recess) of the pixel defining layer 245, the concave shape serves as a guide line for the conductive ink 260 to be applied later. The conductive ink 260 with low resistance is applied within the concave shaped portion, thereby reducing the resistance of the cathode electrode 255.

Referring to FIG. 2A, a buffer layer 205 is first formed on a substrate 200. The substrate 200 may be a substrate of glass, plastic, quartz, silicon, or metal, and the buffer layer 205 may be a silicon dioxide film ($SiO_2$), a silicon nitride film ($SiN_x$), a silicon oxynitride film ($SiO_2N_x$), or a multilayer thereof.

A semiconductor pattern 208 is formed on the buffer layer 205 and is formed in the thin film transistor region as shown in FIG. 2A. The semiconductor pattern 208 may be an amorphous silicon film (a-Si) or a polycrystalline silicon film (poly-Si) fabricated by crystallizing an amorphous silicon film. In one embodiment, the semiconductor pattern 208 is a polycrystalline silicon film having high charge mobility.

A gate insulating layer 210 is formed on the substrate 200 including the semiconductor layer 208. The gate insulating layer 210 may be a silicon dioxide film ($SiO_2$), a silicon nitride film ($SiN_x$), a silicon oxynitride film ($SiO_2N_x$), or a multilayer that includes two or more of these films and/or other suitable materials.

A first electrode 212 of a storage capacitor Cst is formed in the storage capacitor region on the gate insulating layer 210, and a gate electrode 214 overlapping the semiconductor layer 208 is formed in the thin film transistor region. At this time, scan lines (not shown) may concurrently be formed with the formation of the first electrode 212 and the gate electrode 214.

Then, source/drain regions 208a and 208b are formed in a region not overlapped with the gate electrode 214 on the semiconductor layer 208, by implanting conductive impurities (n− ion or p+ ion) in the semiconductor layer 208 of the thin film transistor region using the gate electrode 214 as a mask. At this time, a channel region 208c is defined between the source/drain regions 208a/208b.

Next, an interlayer insulating layer 220 is formed on the substrate on the first electrode 212 of the storage capacitor Cst and the gate electrode 214, and one or more contact holes are formed within the interlayer insulating layer 220 and the gate insulating layer 210 to expose the semiconductor layer 208.

A conductive layer is stacked and patterned on the substrate in the region of the contact holes so that source/drain electrodes 221 and 223 are formed in the thin film transistor region. A data line 225 is formed in a data line region and a second electrode 229 of the storage capacitor Cst is formed in the region overlapping the first electrode 212 of the storage capacitor Cst in the storage capacitor region.

Here, the semiconductor layer 208, the gate insulating layer 210, the gate electrode 214, the source electrode 221, and the drain electrode 223, which are in the thin film transistor region, form the thin film transistor. The thin film transistor may be a driving transistor such as M2 in FIG. 1 for generating a driving current within the pixel, or in alternate embodiments, the thin film transistor may be a light emission control transistor (not illustrated in FIG. 1) for supplying the driving current to an EL element.

A stacked structure including the first electrode 212, the interlayer insulating layer 220, and the second electrode 229, which are in the storage capacitor region, forms the storage capacitor Cst illustrated in FIG. 1.

Thereafter, a passivation layer 230 is formed on the substrate 200 including the source electrode 221, the drain electrode 223, the data line 225, and the second electrode 229 patterned with the conductive layer. The passivation layer 230 may be formed of a silicon dioxide film ($SiO_2$), a silicon nitride film ($SiN_x$), or a multilayer including these two films and/or other suitable materials. In one embodiment, the passivation layer 230 is the silicon nitride film ($SiN_x$) that can protect the thin film transistor below it by effectively shielding gas and moisture, and can protect an incomplete binding that occurs at a grain boundary of the polycrystalline silicon film containing rich hydrogen.

A first via hole 232 is formed through the passivation layer 230 to expose the drain electrode 223 of the thin film transistor, and a planarization layer 235 for smoothing out any steps in lower layers is formed on the passivation layer 230. The planarization layer 235 may be formed of an organic layer such as a benzocyclobutene (BCB) film, a polyimide film, or a polyacrylic film. A second via hole 237 is formed within the thin film transistor region through the planarization layer 235 to expose the drain electrode 223 of the thin film transistor.

A first electrode 240 is formed in the storage capacitor region and the thin film transistor region, on the planarization layer 235. The first electrode 240 is coupled to the drain electrode 223 exposed by the first via hole 232 and the second via hole 237 in the thin film transistor region.

Because the pixel illustrated in FIG. 2A is a top emission type, the first electrode 240 serves as the anode electrode. The first electrode 240 may be formed of a reflective, conductive layer. The light reflective, conductive layer may include materials with a high work function such as Ag, Al, Ni, Pt, and/or Pd, or an alloy layer of two or more of these materials. In alternate embodiments, the light reflective, conductive layer may include materials with a low work function such as Mg, Ca, Al, Ag, and/or Ba, or an alloy layer thereof. In yet other embodiments, a reflective layer 242 is formed first, followed by forming the first electrode 240, such that the first electrode 240 is a light transmitting conductive layer formed on the reflective film 242. In this embodiment, the light transmitting conductive layer may be an indium tin oxide (ITO) film or an indium zinc oxide (IZO). In certain embodiments, the reflective film pattern 242 has a reflectivity above 60%. The reflective film pattern 242 may be aluminum (Al), an aluminum alloy, silver (Ag), a silver alloy, or an alloy layer of one or more of these materials. Such a reflective pattern 242 may be formed to be spaced at an interval, e.g., a predetermined interval, from the via hole 237.

The first electrode 240 may be formed of an ITO film or an IZO film, and may be formed of Mg, Ca, Al, Ag, and Ba or an alloy layer of two or more of these materials that is thin enough to transmit light.

Next, a pixel defining layer (PDL) 245 is formed on the first electrode 240. The pixel defined layer 245 may be formed, for example, of benzocyclobutene (BCB), acyclic based photoresist, phenol based photoresist, or imide based photoresist.

In one embodiment, the conductive ink forming region and an opening part 247 are defined in the pixel defining layer 245. According to this embodiment, a recess 249 is made by etching or otherwise forming a depression or an opening in the pixel defining layer 245 between the thin film transistor region and the data line region (part of the non-light emitting region). The opening part 247 is similarly formed by etching or otherwise forming an opening in the pixel defining layer 245 to expose at least a portion of the first electrode 240 in a light emitting region of the pixel.

The recess 249 is in the conductive ink forming region, where the conductive ink is to be placed, as described later. The recess 249 may extend only through the pixel defining layer 245, or, in another embodiment as illustrated in FIG. 2B, the recess 249' may extend at least partially through the planarization layer 235 in so that it has a deeper valley in a concave shape.

The recess 249 or 249' serves as a guide line for the conductive ink 260 to be applied later, and the conductive ink 260 with low resistance is applied to the region so that the resistance of the cathode electrode is reduced.

An organic light emitting layer 250 is formed on the first electrode 240 exposed within the opening part 247. The organic light emitting layer 250 may be formed, for example, using a vapor deposition method, an ink jet printing method, or a laser thermal transfer method. Furthermore, a hole injection layer, a hole transportation layer, a hole suppression layer, an electron transportation layer, or an electron injection layer may be formed on or under the organic light emitting layer 250.

The second electrode 255 is formed on the entire surface of the substrate including the organic light emitting layer 250 and the pixel defining layer 245. The second electrode 255 serves as a cathode electrode and, in one embodiment, is formed of a transflective conductive layer. The transflective conductive layer may be an ITO film or an IZO film, and may include Mg, Ca, Al, Ag, Ba, or an alloy layer of two or more of these materials that is thin enough to transmit light.

Because the second electrode 255 is formed on the entire surface of the substrate, it is formed in the recess 249 as well. That is, a portion of the second electrode 255 is on an inner wall of the depression or recess 249.

In the case of the top emission display, the second electrode 255 (the cathode electrode in this embodiment) is made of a material having a low work function and is thin enough to exhibit a transflective characteristic. Without any structure to reduce the resistance, this cathode electrode 255 exhibits a high resistance.

To reduce the resistance of the cathode electrode 255, an exemplary embodiment of the present invention further utilizes the recess 249 having a concave shape in the non-light emitting region as a conductive ink forming region. A conductive ink 260 with a low resistance is applied on the upper side of the cathode electrode 255 by an inkjet printing method.

In the embodiments shown in FIGS. 2A-2B, the conductive ink forming region is shown as formed between the thin film transistor region and the data line region for illustrative purposes only, and the present invention is not limited thereto. In alternative embodiments, the conductive ink forming region may be formed in the non-light emitting region overlapping a portion or all of the data line region.

FIGS. 3A to 3D are cross-sectional views showing a process of fabricating an organic light emitting display according to an exemplary embodiment of the present invention.

In this embodiment, the conductive ink forming region is formed in the non-light emitting region between the thin film transistor region and the data line region, as described above. Accordingly, for convenience of explanation, FIGS. 3A-3D only illustrate a fabrication process in the conductive ink forming region.

Figure 3A:
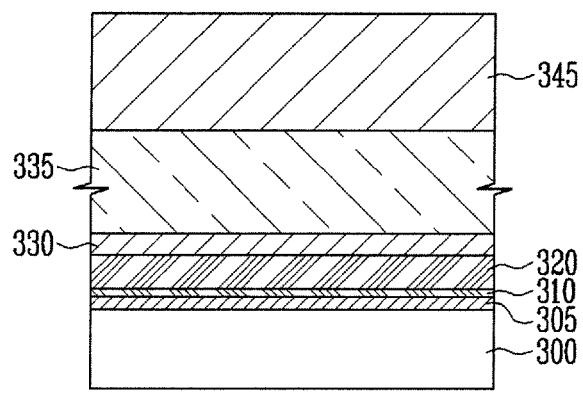
FIGS. 3A to 3D are cross-sectional views illustrating a method of fabricating an organic light emitting display according to an exemplary embodiment of the present invention.

First, as shown in FIG. 3A, a gate insulating layer 310, an interlayer insulating layer 320, a passivation layer 330, a planarization layer 335, and a pixel defining layer 345 are sequentially formed on a first substrate 300 having a buffer layer 305 formed thereon, similar to the embodiment illustrated in FIG. 2A.

The planarization layer 335 may be formed of a benzocyclobutene (BCB) layer, a polyimide layer, or a polyacyclic layer, and the pixel defining layer 345 may be formed of a benzocyclobutene (BCB), acyclic based photoresist, phenol-based photoresist, or imide-based photoresist.

Figure 3B:
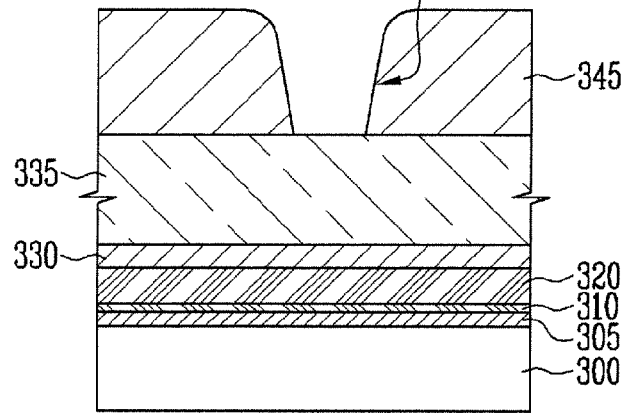

Next, referring to FIG. 3B, an etch is performed on the pixel defining layer 345 to form a recess 349 in a portion of the pixel defining layer 345.

The region where the recess 349 is formed is where the conductive ink will be placed, as described later. At this time, the recess 349 may extend more deeply into the planarization layer 335 in addition to the pixel defining layer 345, creating a deeper valley in a concave shape.

In other words, the recess 349 serves as a guide line for the conductive ink 360 to be applied later and the conductive ink 360 with a low resistance is applied to the region to reduce the resistance of the cathode electrode.

Figure 3C:
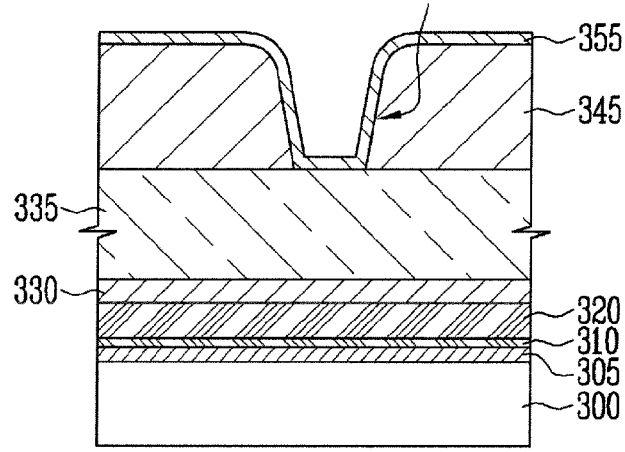

Then, as shown in FIG. 3C, the second electrode 355 as the cathode electrode is formed on the substrate 300 including the recess 349.

In the case of the top emission display, the second electrode 355 (the cathode electrode in this embodiment) is made of a material having a low work function and is thin enough to exhibit a transflective characteristic. Without any structure to reduce the resistance, this cathode electrode 355 exhibits a high resistance.

Figure 3D:
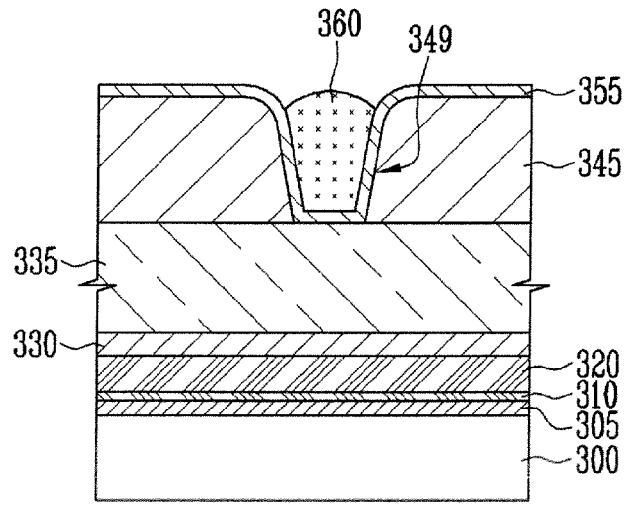

To reduce the resistance of the cathode electrode 355, as shown in FIG. 3D, an embodiment of the present invention places a conductive ink 360 with a low resistance on the cathode electrode 355 in the region formed with a valley in a concave shape by the recess 349 by utilizing an inkjet printing method.

According to an exemplary embodiment, the conductive ink contains high-conductivity materials, for example, Ag or carbon nanotubes. A solvent in the conductive ink may be a material with a boiling point less than 100° C., such as alcohol, ether, benzene, ethyl acetate, chloroform, etc. In this way, further wiring may be formed through low temperature firing after applying the conductive ink.

FIGS. 4A to 4D are plan views of an organic light emitting display according to exemplary embodiments of the present invention illustrating various configurations of the conductive ink forming regions. In each of the embodiments illustrated in FIGS. 4A to 4D, the conductive ink is placed in a recess to reduce the resistance of a surface electrode.

Figure 4A:
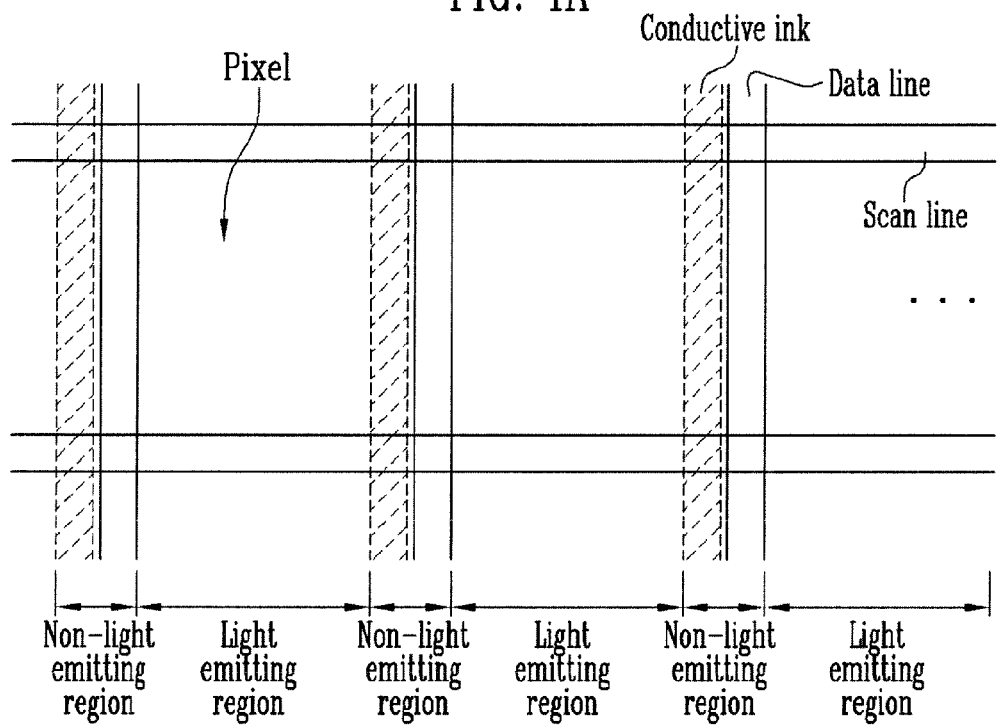

FIG. 4A illustrates one embodiment having conductive ink forming regions extending as continuous segments along a plurality of pixels. In this embodiment, the conductive ink forming regions extend vertically across the display region. As in the embodiments illustrated in FIGS. 2A and 2B, the conductive ink forming regions are placed between the pixels and the data line regions, without overlapping the data line regions.

Figure 4B:
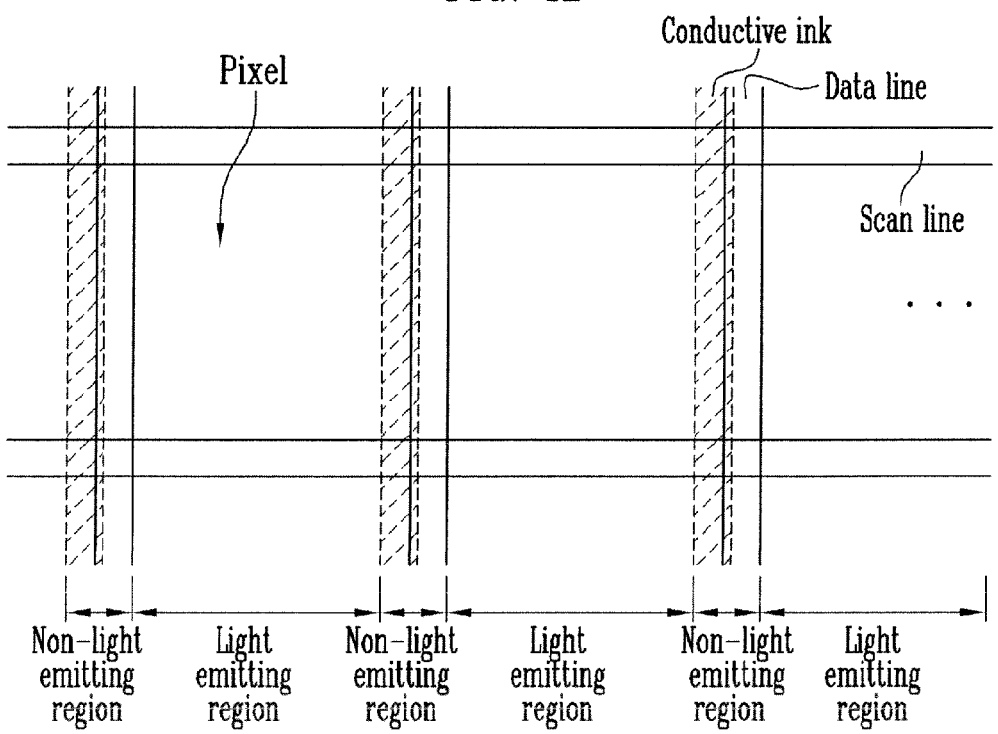

FIG. 4B illustrates an embodiment having conductive ink forming regions extending as continuous segments along a plurality of pixels. Unlike the embodiment illustrated in FIG. 4A, here the conductive ink forming regions are shown as partially overlapping the data line regions. One skilled in the art will comprehend that alternate embodiments are possible that are still within the scope of this invention. For example, the conductive ink forming regions may completely overlap with the data line regions, or the conductive ink forming regions may extend horizontally or in any other suitable direction.

FIG. 4C illustrates an embodiment having conductive ink forming regions as short segments that each extend vertically only partially across the length of a single pixel. Here, the conductive ink forming regions are located near the crossings of the data lines and the scan lines, but not overlapping with the data line regions.

FIG. 4D illustrates an embodiment having conductive ink forming regions as short segments that each extend vertically only partially across the length of a single pixel. Unlike the embodiment illustrated in FIG. 4C, here the conductive ink forming regions are shown partially overlapping the data line regions. One skilled in the art will comprehend that alternate embodiments are possible that are still within the scope of this invention. For example, the conductive ink forming regions may completely overlap with the data line regions, or the conductive ink forming regions may be placed in essentially any non-light emitting region on the surface electrode.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalent thereof.

What is claimed is:

1. An organic light emitting display comprising:
   a pixel defining layer on a substrate;
   a recess at a non-light emitting region of the pixel defining layer;
   an electrode on the substrate, the electrode including a portion in the recess of the pixel defining layer; and
   a conductive ink on only some portions of the electrode, including the portion of the electrode in the recess, wherein the electrode separates the conductive ink from each layer of the organic light emitting display between the electrode and the substrate.

2. The organic light emitting display according to claim 1, wherein the non-light emitting region is between a thin film transistor region of a pixel and a data line region.

3. The organic light emitting display according to claim 1, wherein the recess extends into a planarization layer under the pixel defining layer.

4. The organic light emitting display according to claim 1, wherein the electrode is a cathode electrode comprising a transflective layer.

5. The organic light emitting display according to claim 1, wherein the conductive ink comprises a high-conductivity material.

6. The organic light emitting display according to claim 1, wherein the pixel defining layer has at least one recess at the non-light emitting region, the electrode includes portions in each of the at least one recess, and the conductive ink is only on the portions of the electrode in each of the at least one recess.

7. A method of fabricating an organic light emitting display comprising:
   forming a pixel defining layer on a substrate;
   forming a recess in a non-light emitting region of the pixel defining layer;
   forming a electrode on the pixel defining layer, the electrode having a portion in the recess; and
   placing a conductive ink on only some portions of the electrode, including the portion of the electrode in the recess, wherein the electrode separates the conductive ink from each layer of the organic light emitting display formed between the electrode and the substrate.

8. The method of fabricating an organic light emitting display according to claim 7, wherein the non-light emitting region is between a thin film transistor region of a pixel and a data line region.

9. The method of fabricating an organic light emitting display according to claim 7, wherein forming the recess further comprises extending the recess into a planarization layer under the pixel defining layer.

10. The method of fabricating an organic light emitting display according to claim 7, wherein the electrode is a cathode electrode comprising a transflective layer.

11. The method of fabricating an organic light emitting display according to claim 7, wherein placing the conductive ink comprises inkjet printing.

12. The method of fabricating an organic light emitting display according to claim 11, wherein inkjet printing utilizes a solvent comprising a material with a boiling point less than 100° C.

13. The method of fabricating an organic light emitting display according to claim 12, wherein the solvent comprises a material selected from the group consisting of alcohol, ether, benzene, ethyl acetate, chloroform, and combinations thereof.

14. A display device comprising:
   a plurality of light emitting regions;
   a plurality of non-light emitting regions, each non-light emitting region between adjacent ones of the light emitting regions;
   a cathode electrode on the light emitting regions and the non-light emitting regions, the cathode electrode having a recess at at least one of the non-light emitting regions; and
   a conductive ink on only some portions of the cathode electrode, including in the recess, wherein the cathode electrode separates the conductive ink from portions of the at least one of the non-light emitting regions positioned on a side of the cathode electrode opposite the side on which the conductive ink is positioned.

15. The display device of claim 14, further comprising a pixel defining layer under the cathode electrode, the pixel defining layer defining the plurality of pixels having the plurality of light emitting regions and having a first depression corresponding to the recess, such that a portion of the cathode electrode is on an inner wall of the first depression.

16. The display device of claim 15, further comprising a planarization layer under the pixel defining layer, the planarization layer having a second depression corresponding to the recess, such that another portion of the cathode electrode is on an inner wall of the second depression.

* * * * *

UNITED STATES PATENT AND TRADEMARK OFFICE
CERTIFICATE OF CORRECTION

PATENT NO.        : 8,183,763 B2
APPLICATION NO.   : 12/401465
DATED             : May 22, 2012
INVENTOR(S)       : Myung-Won Song It is certified that error appears in the above-identified patent and that said Letters Patent is hereby corrected as shown below:

In the Claims

Column 9, Claim 7, line 26        Delete "a"

Insert -- an --

Signed and Sealed this
Twenty-seventh Day of August, 2013

Teresa Stanek Rea
*Acting Director of the United States Patent and Trademark Office*